(12) United States Patent
Biedka et al.

(10) Patent No.: US 7,688,157 B2
(45) Date of Patent: Mar. 30, 2010

(54) SELECTIVE ENVELOPE MODULATION ENABLING REDUCED CURRENT CONSUMPTION

(75) Inventors: Thomas E. Biedka, San Jose, CA (US); Paul Cheng-Po Liang, Santa Clara, CA (US); Gary L. Do, San Jose, CA (US)

(73) Assignee: Panasonic Corporation, Osaka (JP)

( * ) Notice: Subject to any disclaimer, the term of this patent is extended or adjusted under 35 U.S.C. 154(b) by 151 days.

(21) Appl. No.: 12/079,353

(22) Filed: Mar. 25, 2008

(65) Prior Publication Data

US 2008/0246550 A1  Oct. 9, 2008

Related U.S. Application Data

(60) Provisional application No. 60/922,261, filed on Apr. 5, 2007.

(51) Int. Cl.
*H03C 1/00* (2006.01)
*H03C 3/00* (2006.01)

(52) U.S. Cl. .................. 332/149; 332/145; 332/151; 330/10

(58) Field of Classification Search ......... 332/103–105, 332/144, 145, 149, 151–154; 330/10; 375/295; 455/102, 127.1, 127.5
See application file for complete search history.

(56) References Cited

U.S. PATENT DOCUMENTS 6,101,216 A * 8/2000 Henderson et al. .......... 375/222
7,333,781 B1 * 2/2008 Stockstad et al. ........... 455/126

* cited by examiner

*Primary Examiner*—David Mis (57) ABSTRACT

A modulation system includes an amplitude modulation path and a phase modulation path coupled to the amplitude modulation path. One of the amplitude modulation path and the phase modulation path receive a reduced current such that the reduced current reduces power consumption by the system. Preferably, the amplitude modulation path receives the reduced current. The amplitude modulation path has a first set of components and a second set of components. The first set of components consumes less power by using slower operation. The second set of components consumes less power by effectively not operating, or being turned off.

4 Claims, 4 Drawing Sheets

SELECTIVE ENVELOPE MODULATION ENABLING REDUCED CURRENT CONSUMPTION

RELATED APPLICATIONS

This Patent Application claims priority under 35 U.S.C. §119(e) of the co-owned U.S. Provisional Patent Application No. 60/922,261, filed Apr. 5, 2007, and entitled "SELECTIVE ENVELOPE MODULATION ENABLING REDUCED CURRENT CONSUMPTION" which is also hereby incorporated by reference in its entirety.

FIELD OF THE INVENTION

The present invention is related to the field of envelope modulation, and is more specifically directed to selective envelope modulation enabling reduced current consumption.

BACKGROUND

The 3GPP standard TS25.101 (section 6.6.2.2) sets the following requirements on adjacent channel leakage power ratio measurement for mobile phones: Adjacent channel leakage power ratio (ACLR) is the ratio of the transmitted power to the power measured after a receiver filter in the adjacent channel(s). Both the transmitted power and the received power are measured with a filter that has a root-raised cosine (RRC) filter response with roll-off $\alpha=0.22$ and a bandwidth equal to the chip rate. The following table indicates the requirement for ACLR according to the 3GPP TS25.101 standard.

| UE channel | ACLR limit |
| --- | --- |
| ±5 MHz | −33 dB or −50 dBm, which ever is higher |
| ±10 MHz | −43 dB or −50 dBm, which ever is higher |

These values apply to the complete mobile phone. The requirements for the different modules and components of a mobile phone are typically more demanding in order to meet the overall performance requirement for the standard. One of ordinary skill recognizes additional standards, such as, for example, the Universal Mobile Telephone Service (UMTS) standard, which is further discussed below in relation to particular embodiments of the invention.

SUMMARY OF THE DISCLOSURE

A modulation system includes an amplitude modulation path and a phase modulation path coupled to the amplitude modulation path. One of the amplitude modulation path and the phase modulation path receive a reduced signal such that the reduced signal reduces power consumption by the system. Preferably, the amplitude modulation path receives the reduced current. The amplitude modulation path has a first set of components and a second set of components. The first set of components consumes less power by using slower operation. The second set of components consumes less power by effectively not operating, or being turned off.

In the modulation system of a particular embodiment, the second set of components includes a correction module, an alignment module, and a filter, and the first set of components includes an envelope type digital-to-analog converter and an operational amplifier. Typically, the envelope type digital-to-analog converter includes a modulation converter, an amplitude control converter, a filter, and an operational amplifier. The modulation converter is configured for receiving a first control signal, and the amplitude control converter is configured for receiving a second control signal. Preferably, the first and second control signals adjust the amount of power consumption by the system. For some embodiments, one of the first and second control signals comprises a clock signal.

The amplitude path of some embodiments includes an alignment module, a digital-to-analog converter, a filter, and an operational amplifier. The alignment module is for providing an amplitude signal to the amplitude modulation path and a phase signal to the phase modulation path. The digital-to-analog converter is coupled to the alignment module, and is configured to receive the amplitude signal and a control signal, and output a modified amplitude signal based on the control signal. The filter is coupled to the digital-to-analog converter. The filter is configured to receive the modified amplitude signal, and output a filtered signal. The operational amplifier is coupled to the filter, and is for amplifying the filtered signal.

In implementations of the system, the control signal controls the rate of operation of the amplitude modulation path, such that a reduced rate of operation results in lower power consumption. Preferably, the system is a polar modulation system.

A method of efficient signal modulation receives an amplitude signal and a phase signal. The method modulates a carrier signal by using one of the amplitude signal and the phase signal to generate a modulated signal. The method reduces power consumption required by the modulator such that a power savings results without substantially changing the modulated signal. In a particular embodiment, the method receives a control signal that adjusts the rate of the modulating, and in some embodiments, the control signal includes a clock rate.

Preferably, the amplitude signal is received by an amplitude path, the phase signal is received by a phase path, and reducing power consumption comprises reducing a current supplied to the amplitude path. In these embodiments, the amount of power consumption is related to the rate of operation of the amplitude path and reducing power consumption includes reducing the rate of operation of the amplitude path. Some embodiments advantageously control the modulating. For instance, typically, the amount of power consumption is related to the rate of the modulating, and reducing the power consumption includes reducing the rate of the modulating.

In a particular embodiment, the controlling includes modifying a control signal. For instance, in some of these embodiments, the controlling includes decreasing a clock rate. In some cases, components of the amplitude modulation path are slowed in operation such that the effective rate of the modulating is substantially zero. Preferably, the signal modulation involves polar modulation.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

In modern high capacity wireless communication systems, many signals chosen for transmission use a combination of amplitude modulation (AM) and phase modulation (PM) to minimize the signals' occupied bandwidth. These signals generally use linear circuitry in their implementation, and implement the combined modulation using quadrature (I&Q) techniques.

Some embodiments of the invention employ a polar transmitter that includes an amplitude modulation path and a phase modulation path. When this type of polar transmitter is used, the amplitude modulation path can selectively be disabled if the remaining phase modulated signal still meets the appropriate specifications at that operating condition. These embodiments advantageously draw less current and consume less power than conventional circuits.

Moreover, in the case of a code division multiple access (CDMA) system such as Universal Mobile Telephone Service (UMTS), it is often required to reduce a mobile device's transmit power, to below −30 dBm (decibel-milliwatts) for example, if the mobile device is sufficiently close to a base station or other access point. At such a low transmitter power, the specifications for adjacent channel leakage ratio (ACLR) are relaxed sufficiently to allow the amplitude modulation component of a polar system to be shut down.

In the polar transmitter, the amplitude or magnitude modulation contains information about both the envelope shape and the output power level. Using UMTS as an example, the bandwidth of the magnitude modulation is approximately 10 MHz. The signal processor and digital-to-analog converter (DAC) in the polar system typically operate at an over-sampled rate of 12× to simplify alias filtering. This rate is primarily due to the envelope shape information, while the power level information changes at a much slower rate of about 100 Hz, for example. Thus, if the envelope shape information is no longer needed, the magnitude path bandwidth is advantageously narrowed from about 10 MHz to about 10 KHz. Or, correspondingly, the clock rate for the magnitude path signal processing and the digital-to-analog converter typically drops from over 100 MHz to under 1 MHz. This dramatically and advantageously lowers the corresponding power consumption by the system.

Figure 1:
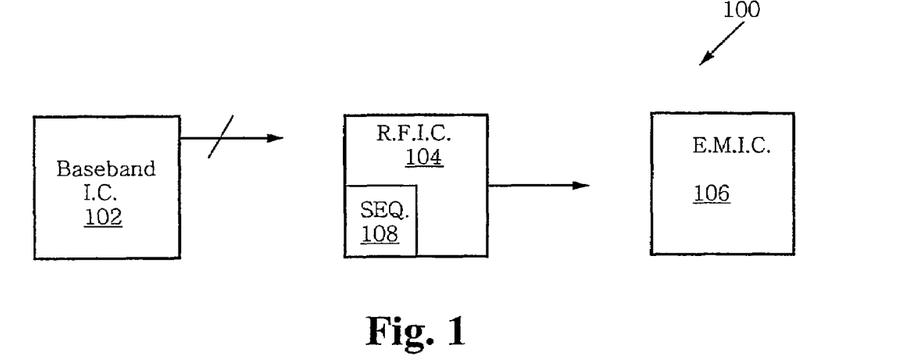
FIG. 1 is a block diagram of a transceiver having integrated circuit components.

FIG. 1 is a block diagram of a modulation system 100. As shown in this figure, the system 100 includes three integrated circuits: a baseband processor 102, a radio frequency (RF) circuit 104, and an envelope modulator 106. The baseband processor 102 sends information about a message signal that is typically in the base band to the radio frequency circuit 104. For instance, the information often includes a power telegram.

The radio frequency circuit 104 typically includes a sequencer 108 that sends control signals to the analog blocks and/or cells in the radio frequency circuit 104 to control modulation. For instance, the sequencer 108 typically controls ramping during ramp up and/or ramp down for signal modulation. Preferably, the sequencer 108 is a microcontroller.

The envelope modulator 106 receives input from the radio frequency integrated circuit 104, and outputs a modulated signal for transmission. In conventional systems, the radio frequency circuit 104 draws a high amount of current, which undesirably results in excess power consumption. Hence, some embodiments reduce or eliminate the amount of current consumed by portions of the radio frequency circuit 104 to yield power savings and more efficient operation.

Figure 2:
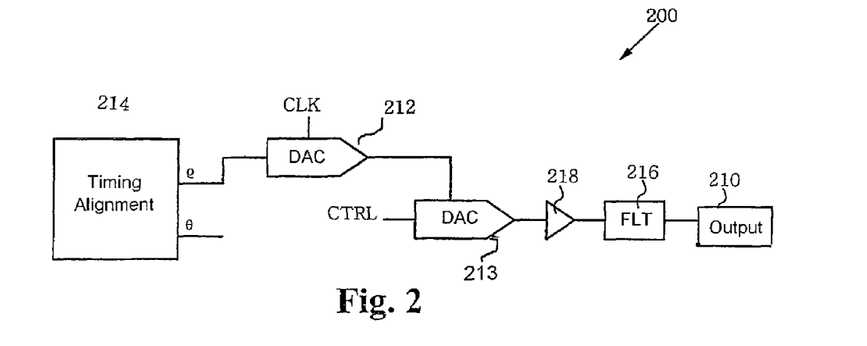
FIG. 2 is a block diagram of a polar modulation system's amplitude path.

For instance, FIG. 2 is a block diagram of a polar modulation system 200 that illustrates some of the components of a radio frequency circuit in greater detail. As shown in this figure, a timing alignment module 214 outputs an amplitude signal ρ to an amplitude path, and a phase signal θ to a phase path. The amplitude path includes a modulation digital-to-analog converter 212, an amplitude control digital-to-analog converter 213, an amplifier 218, a filter 216, and an output pin 210.

The modulation digital-to-analog converter (DAC) 212 receives the amplitude signal from the timing alignment module 214, and outputs to the amplitude control DAC 213. The modulation DAC 212 also receives a clock signal that controls its rate of operation. Conventionally, this clock signal has a high rate, on the order of 50 MHz for example, which causes the modulation DAC 212 to consume a great deal of power.

The amplitude control DAC 213 also receives a control input that typically determines a rate of electrical current flow therethrough, and hence, an amount of power consumption by the system. Preferably, the amplitude control DAC 213 is matched to the performance of the modulation DAC 212. The amplitude control DAC 213 outputs to a set of analog components, such as an amplifier 218 and filter 216, for example. These analog components are known to further draw high amounts of power during operation. The analog components are coupled to an output pin 210 that is typically coupled to an envelope modulator such that the radio frequency circuit provides a generated radio frequency signal to the envelope modulator, as described above.

In terms of power consumption, the modulation DAC 212 typically draws a high amount of power, followed by the analog components such as the amplifier 218 and the filter 216, and by the amplitude control DAC 213. Power savings is generally achieved through two means, lowering speed of operation and/or turning off components. In some embodiments, the components are not actually turned off but instead the speed of operation is reduced to the point where the component is effectively off. For instance, in a particular embodiment, the sequencer 108 of the system sends control signals to the digital and/or analog components discussed above, to reduce the speed of operation of the component, or to effectively shut off the component during operation of the system. More specifically, the sequencer of some embodiments will reduce or eliminate a clock signal to a digital component to slow or prevent its operation. The power savings of such an implementation is further described in relation to FIG. 3.

Figure 3:
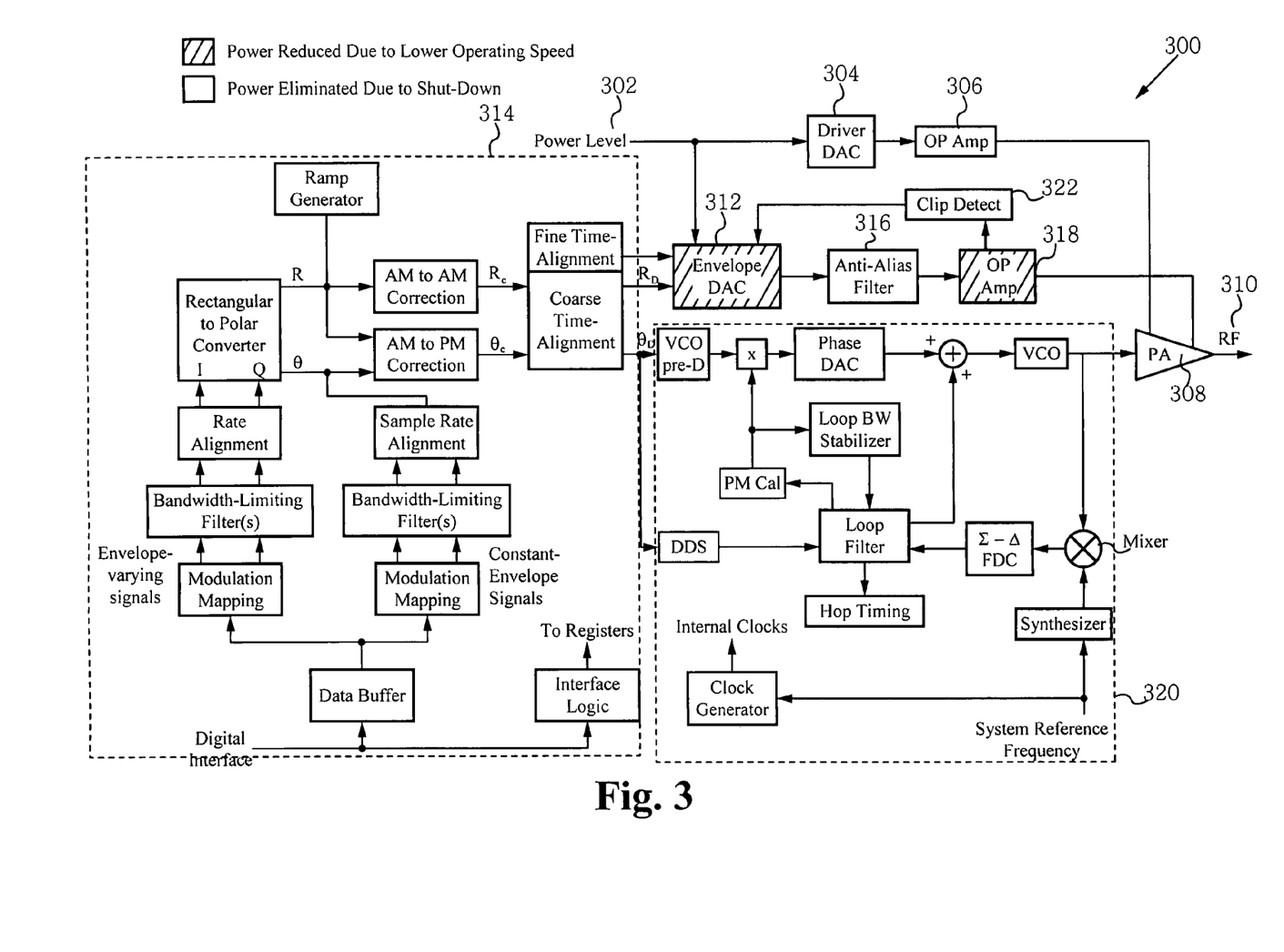
FIG. 3 illustrates a polar modulation system in further detail.

FIG. 3 is a block diagram illustrating a polar modulation system 300 in greater detail. To promote efficient operation, the system 300 selectively shuts down and/or reduces power to certain blocks of the system. Some embodiments reduce the power by using slower operation. The power reduction and/or savings typically occur when the envelope variation is stopped at low output power.

As shown in FIG. 3, the system 300 includes an input power level 302, a driver DAC 304, an operational amplifier 306, a power amplifier 308, and a radio frequency output 310. The driver DAC 304, the operational amplifier 306, and the power amplifier 308, are coupled in series such that when the driver DAC 304 receives the input power level 302, the power amplifier 308 supports the radio frequency output 310 based on the input power level 302.

The system 300 further includes a timing alignment module 314, a phase path 320, and an amplitude path that includes an envelope DAC 312, an anti-alias filter 316, and an operational amplifier 318. The power level 302 is also input to the envelope DAC 312, which receives a magnitude (illustrated as RD) from the alignment module 314, and outputs to the anti-alias filter 316. The anti-alias filter 316 outputs to the operational amplifier 318, which outputs to the power amplifier 308. The operational amplifier 318 is further used to provide feedback to the envelope DAC 312, through a clip detector 322. The output signal from the operational amplifier 318 to the power amplifier 308 causes the power amplifier 308 to output the desired radio frequency output signal 310.

The timing alignment module 314 also provides a phase signal, illustrated as $\theta_D$, to the phase path 320, which provides the primary input to the power amplifier 308. The power amplifier 308 outputs the radio frequency signal 310, as described above.

FIG. 3 particularly illustrates the portions of the system 300 where power consumption is reduced due to a lower operating speed, or due to shut down. For instance, the envelope DAC 312 and the operational amplifier 318 typically consume less power due to operation at a lower speed, while the anti-alias filter 316 and portions of the alignment module 314 reduce power consumption due to shut down. As shown in the figure, the alignment module 314 performs a number of functions including buffering, mapping, filtering, rate alignment, polar conversion, modulation correction, and fine and/or coarse time alignment. Generally, the time alignment and modulation correction components achieve the most power savings in the alignment module, due to shut down of one or more elements of the amplitude modulation path. Preferably, the correction includes both amplitude modulation to amplitude modulation correction, and amplitude modulation to phase modulation correction. Also preferably, the time alignment includes both coarse and fine time alignment.

Figure 4:
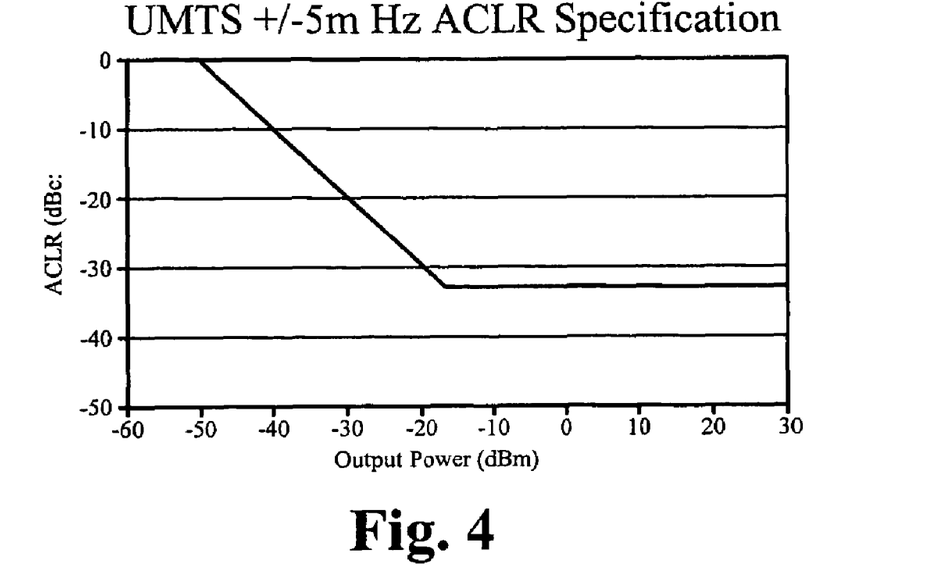
FIG. 4 illustrates sample ACLR specifications for UMTS.

FIG. 4 illustrates sample adjacent channel leakage ratio (ACLR) specifications for UMTS. In this figure, the ACLR is illustrated along the y-axis the ratio of spectral noise integrated over the channel bandwidth in the adjacent channel, over the main channel. The x-axis illustrates the output power in decibel-milliwatts (dBm).

Figure 5:
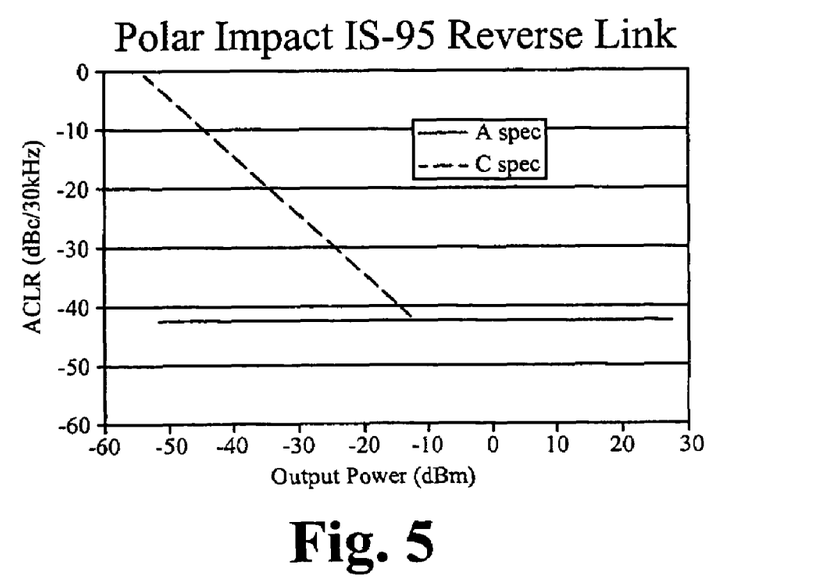
FIG. 5 illustrates sample ACLR specifications for IS-95.

FIG. 5 illustrates sample adjacent channel leakage ratio specifications for IS-95. More specifically, the x-axis in FIG. 5 represents the adjacent channel power ratio (ACPR) in terms of integrated spectral noise at a frequency offset from the carrier frequency (dBc/KHz).

Figure 6:
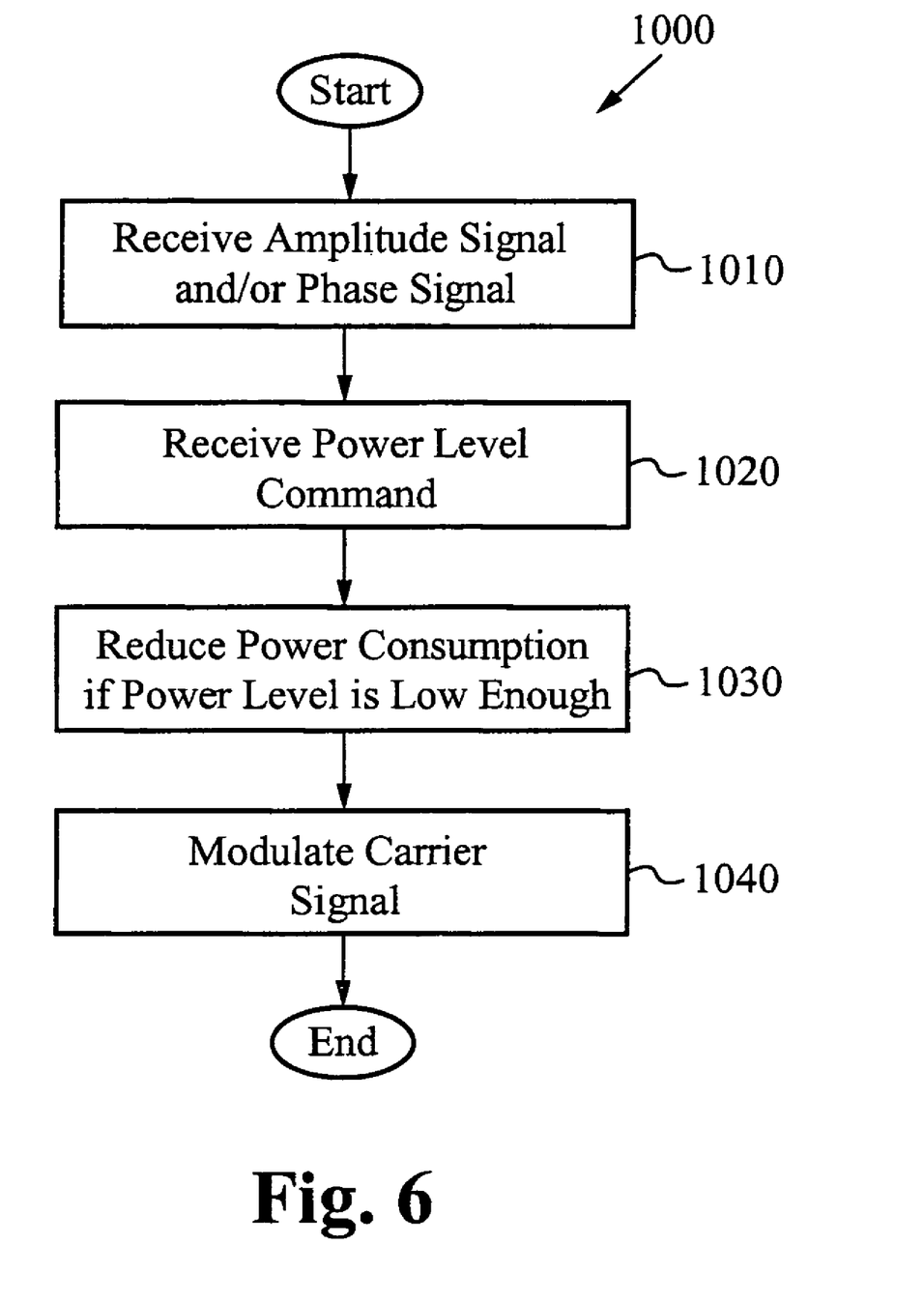
FIG. 6 is a process flow in accordance with some embodiments.

FIG. 6 illustrates a process 1000 that implements a method of efficient signal modulation, in accordance with some embodiments. As shown in this figure, the process 1000 begins at the step 1010, where an amplitude signal is received. In conjunction with the step 1010, or at a separate step, a phase signal is also received. Then, at the step 1020, a power level is received. For example, the power level is obtained based on transmit power control (TPC) information for the UMTS standard. At the step 1030 the power consumption is set, based on the power level. Next at the step 1040, a carrier signal is modulated by using one or more of the amplitude signal and the phase signal thereby generating a modulated signal, where power consumption required by the modulating is reduced, such that a power savings results without substantially changing the modulated signal. After the step 1040, the process 1000 concludes.

In a particular embodiment, the power consumption is reduced by receiving a control signal that adjusts the rate of the modulating such that lower current is drawn by various components of the modulation system. For instance, the control signal of some implementations includes a clock rate, and the electrical current and/or power reductions are effected by reductions in the clock rate. Preferably, the control signal reduces current and/or power consumption at particular times that advantageously do not substantially affect the modulated signal, such that a receiver of the modulated signal continues to receive a transmitted message, while ignorant of the power savings. Such times include, for example, when the transmitter is in closer proximity to the receiver. Moreover, in such situations, adjacent channel leakage is advantageously reduced while maintaining in-specification performance.

Typically, the amplitude signal is received by an amplitude path, and the phase signal is received by a phase path, in the physical implementation. In these embodiments, reducing power consumption generally involves reducing a current supplied to the amplitude path. For instance, the amount of power consumption is preferably related to the rate of operation of the amplitude path of these embodiments, and thus, reducing the rate of operation of the amplitude path effects an overall reduction in power consumption by the system. Accordingly, controlling the modulating in these systems where the amount of power consumption is related to the rate of the modulating, preferably involves reducing the rate of the modulating to reduce the power consumption for the system.

In particular embodiments, the controlling comprises modifying a control signal, such as by decreasing a clock rate, for example. In some of these cases, the effective rate of the modulating is so low, that it is substantially zero. Preferably, the system of some of the embodiments described above includes a polar modulation system.

While the invention has been described with reference to numerous specific details, one of ordinary skill in the art will recognize that the invention can be embodied in other specific forms without departing from the spirit of the invention. For instance, the invention has primarily been described in relation to envelope modulators for polar transceivers. However, the foregoing is applicable to other circuits as well. Thus, one of ordinary skill in the art will understand that the invention is not to be limited by the foregoing illustrative details, but rather is to be defined by the appended claims.

What is claimed is:

1. A modulation system comprising:
    an amplitude modulation path including a first set of components and a second set of components, wherein the first set of components consumes less power by using selective slower operation, wherein the second set of components consumes less power by selective non operation;
    wherein the first set of components includes an envelope type digital-to-analog converter and an operational amplifier, and
    wherein the envelope type digital-to-analog converter comprises:
    a modulation converter configured for receiving a first control signal, and
    an amplitude control converter configured for receiving a second control signal,
    wherein the first and second control signals adjust the amount of power consumption for the system.

2. The modulation system of claim 1, wherein one of the first and second control signals comprises a clock signal.

3. A modulation system having an amplitude path comprising:
- an alignment module for providing an amplitude signal to the amplitude modulation path and a phase signal to a phase modulation path
- a digital-to-analog converter coupled to the alignment module, the digital-to-analog converter configured to:
  receive the amplitude signal and a control signal, and
  output a modified amplitude signal based on the control signal;
- a filter coupled to the digital-to-analog converter, the filter configured to:
  receive the modified amplitude signal, and
  output a filtered signal; and
- an operational amplifier coupled to the filter, the operational amplifier for amplifying the filtered signal.

4. The modulation system of claim 3, wherein the control signal controls the rate of operation of the amplitude modulation path, wherein a reduced rate of operation results in lower power consumption.

* * * * *

UNITED STATES PATENT AND TRADEMARK OFFICE
CERTIFICATE OF CORRECTION

| | | |
|---|---|---|
| PATENT NO. | : 7,688,157 B2 | Page 1 of 1 |
| APPLICATION NO. | : 12/079353 | |
| DATED | : March 30, 2010 | |
| INVENTOR(S) | : Biedka et al. | |

It is certified that error appears in the above-identified patent and that said Letters Patent is hereby corrected as shown below:

In the Claims:
Claim 3, line 7, "path" should read "path;".

Signed and Sealed this

Fourteenth Day of December, 2010

David J. Kappos
*Director of the United States Patent and Trademark Office*

UNITED STATES PATENT AND TRADEMARK OFFICE
CERTIFICATE OF CORRECTION

PATENT NO. : 7,688,157 B2  Page 1 of 1
APPLICATION NO. : 12/079353
DATED : March 30, 2010
INVENTOR(S) : Biedka et al.

It is certified that error appears in the above-identified patent and that said Letters Patent is hereby corrected as shown below:

In the Claims:
Claim 3, Column 7, line 7, "path" should read "path;".

This certificate supersedes the Certificate of Correction issued December 14, 2010.

Signed and Sealed this
Fourth Day of January, 2011

David J. Kappos
*Director of the United States Patent and Trademark Office*